(12) United States Patent
Bhugra et al.

(10) Patent No.: US 8,575,819 B1
(45) Date of Patent: Nov. 5, 2013

(54) MICROELECTROMECHANICAL RESONATORS WITH PASSIVE FREQUENCY TUNING USING BUILT-IN PIEZOELECTRIC-BASED VARACTORS

(75) Inventors: Harmeet Bhugra, San Jose, CA (US); Ashwin Samarao, San Jose, CA (US)

(73) Assignee: Integrated Device Technology, inc., San Jose, CA (US)

( * ) Notice: Subject to any disclaimer, the term of this patent is extended or adjusted under 35 U.S.C. 154(b) by 293 days.

(21) Appl. No.: 13/184,970

(22) Filed: Jul. 18, 2011

(51) Int. Cl.
*H01L 41/107* (2006.01)
*H01L 41/09* (2006.01)
*H03H 9/00* (2006.01)
*H03L 7/00* (2006.01)
*H03L 1/00* (2006.01)

(52) U.S. Cl.
USPC ............ 310/318; 310/317; 331/16; 331/154; 331/175; 333/186

(58) Field of Classification Search
USPC ............ 333/186; 331/16, 18, 154, 175, 176; 310/314–319
See application file for complete search history.

(56) References Cited

U.S. PATENT DOCUMENTS

| | | | |
|---|---|---|---|
| 3,200,354 A * | 8/1965 | White | 257/416 |
| 3,683,213 A | 8/1972 | Staudte | |
| 5,132,643 A | 7/1992 | Ueno et al. | |
| 5,329,256 A | 7/1994 | Higgins, Jr. | |
| 5,585,770 A | 12/1996 | Higgins, Jr. | |
| 5,589,864 A * | 12/1996 | Hadimioglu | 347/46 |
| 6,320,474 B1 | 11/2001 | Kamiya et al. | |
| 6,909,221 B2 | 6/2005 | Ayazi et al. | |
| 6,924,583 B2 * | 8/2005 | Lin et al. | 310/324 |
| 6,943,484 B2 * | 9/2005 | Clark et al. | 310/334 |
| 7,098,748 B2 * | 8/2006 | Schmidt | 331/176 |
| 7,492,241 B2 | 2/2009 | Piazza et al. | |
| 7,639,105 B2 | 12/2009 | Ayazi et al. | |
| 7,791,432 B2 | 9/2010 | Piazza et al. | |
| 7,800,282 B2 | 9/2010 | Ayazi et al. | |
| 7,843,284 B2 | 11/2010 | Ayazi et al. | |
| 7,888,843 B2 | 2/2011 | Ayazi et al. | |
| 7,893,784 B2 | 2/2011 | Hirama | |
| 7,915,974 B2 | 3/2011 | Piazza et al. | |
| 7,924,119 B1 | 4/2011 | Ayazi et al. | |
| 7,939,990 B2 | 5/2011 | Wang et al. | |
| 7,977,850 B2 * | 7/2011 | Allah et al. | 310/320 |
| 2005/0146401 A1 * | 7/2005 | Tilmans et al. | 333/187 |

(Continued)

OTHER PUBLICATIONS

Samarao et al. "Intrinsic Temperature Compensation of Highly Resistive High-Q Silicon Microresonators via Charge Carrier Depletion" Frequency Control Symposium (FCS), Newport Beach, CA, 2010 IEEE International (Jun. 1-4, 2010), pp. 334-339.

(Continued)

*Primary Examiner* — Thomas Dougherty
(74) *Attorney, Agent, or Firm* — Myers, Bigel et al

(57) ABSTRACT

Microelectromechanical resonators include a resonator body with a built-in piezoelectric-based varactor diode. This built-in varactor diode supports passive frequency tuning by enabling low-power manipulation of the stiffness of a piezoelectric layer, in response to controlling charge build-up therein at resonance. A resonator may include a composite stack of a bottom electrode, a piezoelectric layer on the bottom electrode and at least one top electrode on the piezoelectric layer. The piezoelectric layer includes a built-in varactor diode, which is defined by at least two regions having different concentrations of electrically active dopants therein.

20 Claims, 2 Drawing Sheets

(56) References Cited

U.S. PATENT DOCUMENTS

| | | | |
|---|---|---|---|
| 2006/0273867 A1 | 12/2006 | Piazza et al. | |
| 2006/0290449 A1 | 12/2006 | Piazza et al. | |
| 2009/0072663 A1 | 3/2009 | Ayazi et al. | |
| 2009/0108959 A1 | 4/2009 | Piazza et al. | |
| 2009/0144963 A1 | 6/2009 | Piazza et al. | |
| 2009/0302716 A1* | 12/2009 | OHara et al. | 310/363 |
| 2011/0241802 A1* | 10/2011 | Joshi et al. | 333/209 |

OTHER PUBLICATIONS

Shahmohammadi et al. "Passive Tuning in Lateral-Mode Thin-Film Piezoelectric Oscillators", 2011 Joint Conference of the IEEE International Frequency Control Symposium (IFCS) and European Frequency and Time Forum (EFTF), San Francisco, CA, May 2011.

Kim et al. "Capacitive Frequency Tuning of ALN Micromechanical Resonators" Transducers' 11, Beijing, China, Jun. 5-9, 2011, pp. 502-505.

Abdolvand R. et al., "Thin-Film Piezoelectric-on-Silicon Resonators for High-Frequency Reference Oscillator Applications", *IEEE Transactions on Ultrasonics, Ferroelectrics, and Frequency Control*, vol. 55, No. 12, Dec. 2008, pp. 2596-2606.

Kim B. et al., "Capacitive Frequency Tuning of ALN Micromechanical Resonators", *Transducers 2011*, Beijing, China, Jun. 5-9, 2011, pp. 502-505.

Piazza G. et al., "One and Two Port Piezoelectric Contour-Mode MEMS Resonators for Frequency Synthesis", *Proceedings of the 36th European Solid-State Device Research Conference*, pp. 182-185, Sep. 2006.

Piazza G. et al., "Piezoelectric Aluminum Nitride Vibrating Contour-Mode MEMS Resonators", *Journal of Microelectrochemical Systems*, vol. 15, Issue 6, Dec. 2006, pp. 1406-1418.

Samarao et al., "Intrinsic Temperature Compensation of Highly Resistive High-Q Silicon Microresonators via Charge Carrier Depletion", Frequency Control Symposium (FCS), Newport Beach, CA, 2010 IEEE International (Jun. 1-4, 2010), pp. 334-339.

Shahmohammadi M. et al., "Low Jitter Thin-Film Piezoelectric-on-Substrate Oscillators", *Proceedings IEEE International Frequency Control Symposium (IFCS)*, Newport Beach, CA, Jun. 1-4, 2010, pp. 613-617.

Shahmohammadi M. et al., "Passive Tuning in Lateral-Mode Thin-Film Piezoelectric Oscillators", *Proceedings 2011 Joint Conference of the IEEE International Frequency Control Symposium (IFCS 2011) and European Frequency and Time Forum (EFTF)*, San Francisco, CA, May 2011, 5 pages.

\* cited by examiner

MICROELECTROMECHANICAL RESONATORS WITH PASSIVE FREQUENCY TUNING USING BUILT-IN PIEZOELECTRIC-BASED VARACTORS

CROSS-REFERENCE TO RELATED APPLICATION

This application is related to U.S. application Ser. No. 13/175,445, filed Jul. 1, 2011, the disclosure of which is hereby incorporated herein by reference.

FIELD OF THE INVENTION

The present invention relates to integrated circuit devices and, more particularly, to microelectromechanical resonator devices.

BACKGROUND OF THE INVENTION

Frequency references provided by oscillators are required in every clocked electronic system, including communication circuits, microprocessors, and signal processing circuits. Oscillators frequently consist of high performance piezoelectric crystals, such as quartz oscillators. The advantages of quartz oscillators are their stable operating frequency and high quality factor. However, the disadvantages of quartz oscillators are their relatively large size and unsuitability for high integration with electronic circuitry (e.g., CMOS circuits).

Based on these limitations of conventional oscillators, there is a strong interest in the development of fully integrated silicon oscillators. Integration is important not only for reduced size but also reduced power consumption. It is possible to realize an integrated silicon oscillator using the mechanical properties of silicon devices. For example, silicon microelectromechanical (MEMs) resonators can provide small form factor, ease of integration with conventional semiconductor fabrication techniques and high f·Q products. Accordingly, MEMs resonators are considered a desirable alternative to quartz resonators in real-time and other clock applications.

One example of a MEMs resonator includes lateral-mode piezoelectric resonators, such as thin-film piezoelectric-on-silicon (TPoS) resonators, which have been successfully incorporated in low-power and low-noise oscillators. FIG. 1 illustrates a conventional MEMs resonator 10 containing a resonator body 12 that is suspended opposite a recess in a substrate 16 by a pair of opposing tethers 14. This resonator body 12 may include a stack of multiple layers, including a semiconductor body, a bottom electrode on the semiconductor body, a piezoelectric layer on the bottom electrode and a plurality of top electrodes on the piezoelectric layer. The recess may be formed by selectively removing portions of a buried insulating layer within a semiconductor-on-insulator (SOI) substrate 16 containing a semiconductor device layer thereon. Other examples of these types of resonators are disclosed in U.S. Pat. No. 7,939,990 to Wang et al., entitled "Thin-Film Bulk Acoustic Resonators Having Perforated Bodies That Provide Reduced Susceptibility to Process-Induced Lateral Dimension Variations," and in U.S. Pat. No. 7,888,843 to Ayazi et al., entitled "Thin-Film Piezoelectric-on-Insulator Resonators Having Perforated Resonator Bodies Therein," the disclosures of which are hereby incorporated herein by reference. Unfortunately, frequency tuning has not been studied extensively in these types of resonators.

Active frequency tuning techniques that include application of a DC voltage on the piezoelectric layer have been demonstrated, but such tuning typically requires relatively large voltages, which may be incompatible with the low operating voltages of conventional oscillator circuits. Some examples of active frequency tuning in micromechanical resonators are disclosed in U.S. Pat. Nos. 7,639,105 and 7,843,284 to Ayazi et al., entitled "Lithographically-Defined Multi-Standard Multi-Frequency High-Q Tunable Micromechanical Resonators," and in U.S. Pat. No. 7,924,119 to Ayazi et al., entitled Micromechanical Bulk Acoustic Mode Resonators Having Interdigitated Electrodes and Multiple Pairs of Anchor Supports," and in U.S. Pat. No. 7,800,282 to Ayazi et al., entitled Single-Resonator Dual-Frequency Lateral Extension Mode Piezoelectric Oscillators, and Operating Methods Thereof," the disclosures of which are hereby incorporated herein by reference. Based on limitations of active frequency tuning, cost effective passive tuning techniques have been considered.

SUMMARY OF THE INVENTION

Microelectromechanical resonators according to embodiments of the present invention include a resonator body with a built-in piezoelectric-based varactor diode. This built-in varactor diode supports passive frequency tuning by enabling low-power manipulation of the stiffness of a piezoelectric layer, in response to controlling charge build-up therein at resonance. According to some of these embodiments of the invention, a resonator may include a composite stack of a bottom electrode, a piezoelectric layer on the bottom electrode and at least one top electrode on the piezoelectric layer. The piezoelectric layer includes a built-in varactor diode, which is defined by at least two regions having different concentrations of electrically active dopants therein. The electrically active dopants in a first of the at least two regions can be N-type dopants. In particular, the at least two regions may include an N-type piezoelectric layer on an undoped piezoelectric layer. The N-type piezoelectric layer, which may be an aluminum nitride layer, may be doped with N-type impurities selected from a group consisting of silicon and chromium. The bottom electrode and at least one top electrode may also be formed as molybdenum electrodes. However, other piezoelectric and electrode materials besides aluminum nitride and molybdenum may also be used.

According to still further embodiments of the invention, the resonator body may include a semiconductor layer that is anchored to a surrounding substrate by a pair of tethers. In these embodiments, the bottom electrode extends between the semiconductor layer and the piezoelectric layer. The built-in varactor diode may also include an N-type piezoelectric layer on an undoped piezoelectric layer, with the N-type piezoelectric layer defining an interface with the bottom electrode or the at least one top electrode. In addition, the N-type piezoelectric layer may define a doped/undoped piezoelectric junction with the undoped piezoelectric layer. According to still further embodiments of the invention, the at least two regions may include an N-type piezoelectric region and a P-type piezoelectric region that defines a P-N junction with the N-type piezoelectric region. This P-type piezoelectric region may be doped with P-type impurities selected from a group consisting of zinc and magnesium, for example.

According to additional embodiments of the invention, a periodic signal generator may be provided that includes a resonator body and a DC voltage generator. The resonator body may include a composite stack of a semiconductor layer anchored by at least a pair of tethers to a surrounding substrate, a bottom electrode on the semiconductor layer, a piezoelectric layer on the bottom electrode and at least one drive electrode and at least one sense electrode on the piezoelectric layer. The drive and sense electrodes may be patterned as interdigitated electrodes. The piezoelectric layer includes a built-in varactor diode defined by at least two regions having different concentrations of electrically active dopants therein. The DC reference voltage generator supports passive frequency tuning within the resonator body by being electrically coupled to one of the drive electrode and sense electrode. In particular, the voltage generator supports tuning by causing a depletion width (i.e., internal capacitance) of the varactor diode to change when a magnitude of a reference voltage provided by the generator is changed. In some of these embodiments of the invention, the at least two regions may be regions of opposite conductivity type (e.g., N-type and P-type). Alternatively, the at least two regions may be of net first conductivity type (e.g., N-type or P-type). Still further, one of the at least two regions may be undoped and another of the at least two regions may be of net N-type conductivity or net P-type conductivity. The electrically active dopants may be selected from a group consisting of silicon, chromium, zinc and magnesium.

DETAILED DESCRIPTION OF EMBODIMENTS

Figure 1:
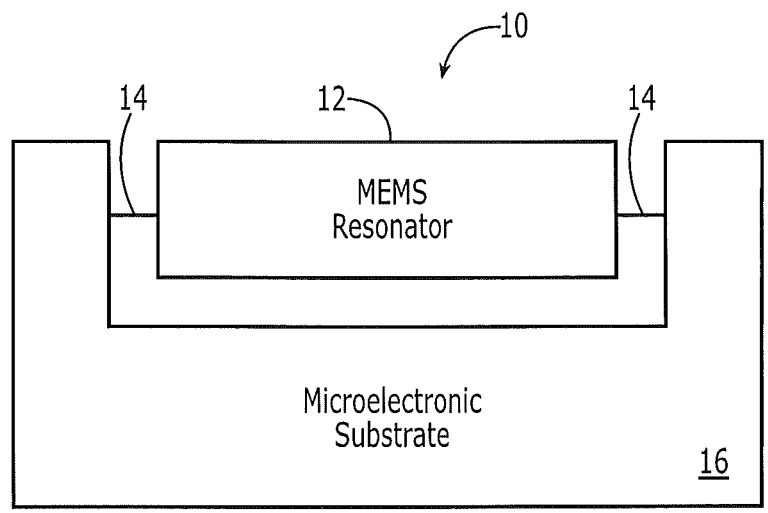
FIG. 1 is a cross-sectional schematic of a conventional microelectromechanical resonator.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof), there are no intervening elements or layers present. Like reference numerals refer to like elements throughout.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Embodiments of the present invention are described herein with reference to cross-section and perspective illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a sharp angle may be somewhat rounded due to manufacturing techniques/tolerances.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2A:
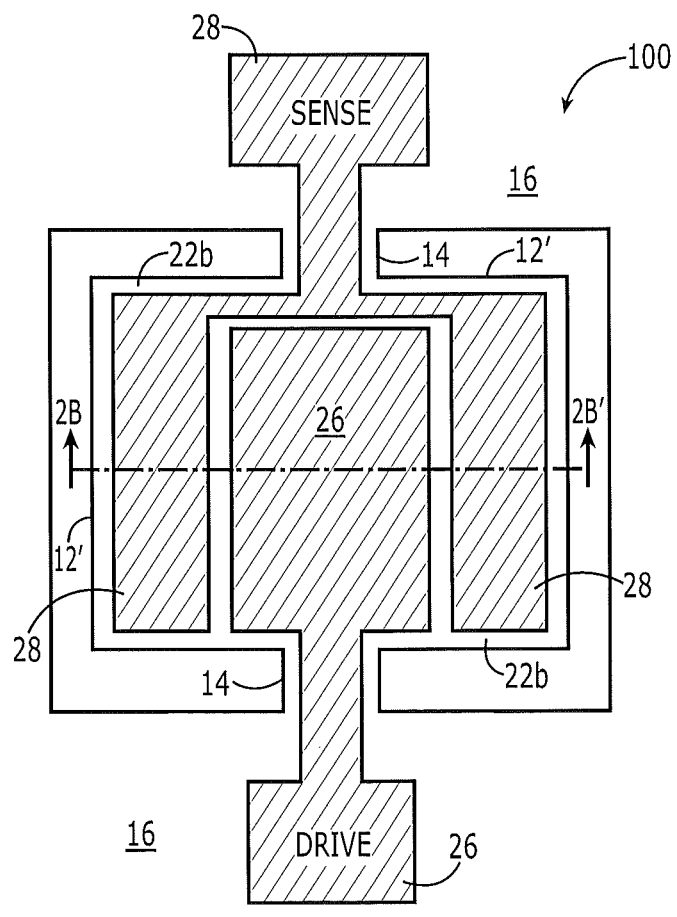
FIG. 2A is a plan view of a piezoelectric-based microelectromechanical resonator according to an embodiment of the invention.
Figure 2B:
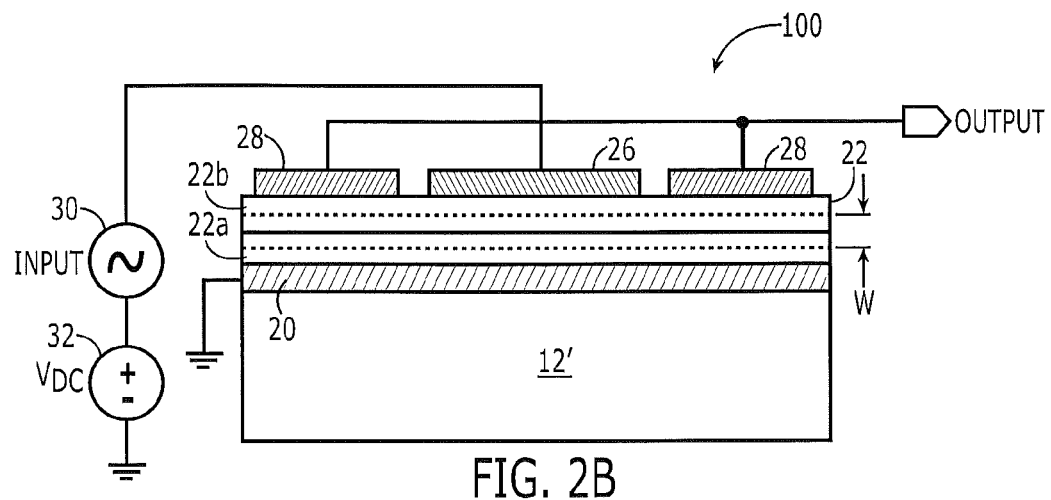
FIG. 2B is a cross-sectional view of the piezoelectric-based microelectromechanical resonator of FIG. 2A, taken along line 2B-2B'.
Figure 2C:
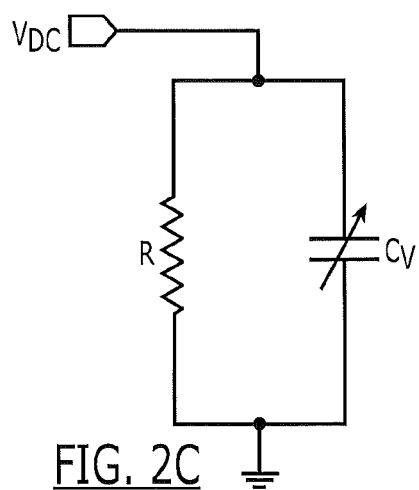
FIG. 2C is an electrical schematic that illustrates a model of the piezoelectric-based varactor diode within the resonator of FIG. 2A.

Referring now to FIGS. 2A-2C, a microelectromechanical resonator 100 according to an embodiment of the present invention includes a resonator body with a built-in piezoelectric-based varactor diode formed by at least two piezoelectric regions. This built-in varactor diode can support passive frequency tuning by enabling low-power manipulation of the stiffness of a piezoelectric layer 22 in response to controlling charge build-up therein at resonance. The resonator 100 includes a resonator body that may be patterned as a composite stack of a patterned semiconductor body layer 12', a bottom electrode 20 on the body layer 12', a piezoelectric layer 22 on the bottom electrode 20 and a pair of interdigitated drive and sense electrodes 26, 28 on the piezoelectric layer 22. The piezoelectric layer 22 includes a built-in varactor diode, which is defined by at least two regions 22a, 22b having different concentrations of electrically active dopants therein. These different concentrations of electrically active dopants result in the formation of a depletion region (see, e.g., dotted lines) within the piezoelectric layer 22 having a width "W", which can be controlled by an externally supplied DC voltage provided by a voltage source 32. This voltage source 32, which represents an AC ground, may be electrically coupled to either the drive electrode 26, as shown, or the sense electrode 28.

The electrically active dopants in a first of the at least two regions can be N-type (or P-type) dopants. For example, the at least two regions may include an N-type piezoelectric layer (22a or 22b) on an undoped piezoelectric layer (22b or 22a). The N-type piezoelectric layer (22a or 22b), which may be an aluminum nitride layer, may be doped with N-type impurities selected from a group consisting of silicon and chromium. The bottom electrode 20 and the top electrodes 26, 28 may be formed as molybdenum (Mo) electrodes. However, other piezoelectric and electrode materials besides aluminum nitride and molybdenum may also be used in alternative embodiments of the invention.

As shown by FIGS. 2A-2B, the resonator body may include a patterned semiconductor body layer 12' that is anchored to a surrounding substrate 16 by at least one pair of tethers 14. In some embodiments of the invention, the bottom electrode 20 may extend between the semiconductor body layer 12' and the piezoelectric layer 22. The built-in varactor diode may be defined from an N-type piezoelectric layer (22a or 22b) on an undoped piezoelectric layer (22b or 22a), with the N-type piezoelectric layer defining an interface with the bottom electrode 20 or the at least one top electrode (26, 28). As shown, the N-type piezoelectric layer (22a or 22b) may define a doped/undoped junction with the undoped piezoelectric layer (22b or 22a). Alternatively, the at least two piezoelectric regions may include an N-type piezoelectric region (22a or 22b) and a P-type piezoelectric region (22b or 22a) that defines a P-N junction with the N-type piezoelectric region. This P-type piezoelectric region may be doped with P-type impurities selected from a group consisting of zinc and magnesium, for example. These N-type and P-type dopants may be incorporated into the piezoelectric layer 22 during deposition using, for example, a magnetron sputtering technique. One example of a technique to deposit an N-type aluminum nitride (AlN) layer includes using 1-2% silicon doped (or 1-5% chromium doped) aluminum targets during sputtering in a nitrogen ($N_2$) ambient.

As illustrated by FIG. 2B, the resonator 100 may be provided as a component of a periodic signal generator containing an input signal generator 30 and the DC voltage generator 32, which are electrically coupled in series to the drive electrode 26. This voltage generator 32 supports tuning by causing a width "W" of a depletion region (i.e., internal capacitance) of the varactor diode (22a/22b) to change when a magnitude of a reference voltage $V_{DC}$ provided by the generator is varied. This varactor diode may be modeled as shown by FIG. 2C, which highlights how adjacent piezoelectric regions having unequal doping concentrations therein can operate as a variable capacitor ($C_V$) that supports tuning by manipulating charge build-up within the piezoelectric layer 22 and, therefore, a stiffness of the piezoelectric layer 22. Although not wishing to be bound by any theory, the charge depletion provided by the varactor may also contribute to TCF (i.e., temperature coefficient of frequency) compensation within the piezoelectric layer 22.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A microelectromechanical resonator, comprising:
a resonator body comprising a composite stack of a bottom electrode, a piezoelectric layer on said bottom electrode and at least one top electrode on said piezoelectric layer, said piezoelectric layer comprising a built-in varactor diode defined by at least two regions in said piezoelectric layer having different concentrations of electrically active dopants therein.

2. The resonator of claim 1, wherein the electrically active dopants in a first of the at least two regions are N-type dopants.

3. The resonator of claim 1, wherein the at least two regions comprise an N-type piezoelectric layer on an undoped piezoelectric layer.

4. The resonator of claim 1, wherein the built-in varactor diode comprises a first piezoelectric region therein doped with N-type impurities selected from a group consisting of silicon and chromium.

5. The resonator of claim 4, wherein said piezoelectric layer comprises aluminum nitride.

6. The resonator of claim 5, wherein said bottom electrode and said at least one top electrode comprise molybdenum.

7. The resonator of claim 1, wherein said resonator body comprises a suspended semiconductor layer anchored to a surrounding substrate by a pair of tethers; and wherein said bottom electrode extends between the semiconductor layer and said piezoelectric layer.

8. The resonator of claim 7, wherein the built-in varactor comprises an N-type piezoelectric layer on an undoped piezoelectric layer; and wherein the N-type piezoelectric layer defines an interface with said bottom electrode or said at least one top electrode.

9. The resonator of claim 7, wherein the N-type piezoelectric layer defines a doped/undoped piezoelectric junction with the undoped piezoelectric layer.

10. The resonator of claim 9, wherein the N-type piezoelectric layer comprises an N-type aluminum nitride layer having impurities therein selected from a group consisting of silicon and chromium.

11. The resonator of claim 1, wherein the at least two regions comprise an N-type piezoelectric region and a P-type piezoelectric region that defines a P-N junction with the N-type piezoelectric region.

12. The resonator of claim 11, wherein the P-type piezoelectric region is doped with P-type impurities selected from a group consisting of zinc and magnesium.

13. The resonator of claim 1, wherein the at least two regions comprise a N-type aluminum nitride region and at least one of an undoped aluminum nitride region and a P-type aluminum nitride region.

14. The resonator of claim 1, wherein the at least two regions comprise a P-type aluminum nitride region and at least one of an undoped aluminum nitride region and an N-type aluminum nitride region.

15. A periodic signal generator, comprising:
a resonator body including a composite stack of a semiconductor layer anchored by at least a pair of tethers to a surrounding substrate, a bottom electrode on the semiconductor layer, a piezoelectric layer on the bottom electrode and at least one sense electrode and at least one drive electrode on the piezoelectric layer, said piezoelectric layer comprising a built-in varactor diode defined by at least two regions in said piezoelectric layer having different concentrations of electrically active dopants therein; and a DC reference voltage generator electrically coupled to one of the sense electrode and drive electrode.

16. The generator of claim 15, wherein the at least two regions are of opposite conductivity type.

17. The generator of claim 15, wherein the at least two regions are of net first conductivity type.

18. The generator of claim 15, wherein one of the at least two regions is undoped and another of the at least two regions is of net N-type conductivity or net P-type conductivity.

19. The generator of claim 15, wherein one of the at least two regions is doped with dopants selected from a group consisting of silicon, chromium, zinc and magnesium.

20. The generator of claim 15, wherein a width of a depletion region in the varactor diode changes in response to changes in a magnitude of a voltage generated by said DC reference voltage generator.

* * * * *